United States Patent [19]
Lewyn

[11] Patent Number: 5,099,205
[45] Date of Patent: Mar. 24, 1992

[54] BALANCED CASCODE CURRENT MIRROR

[75] Inventor: Lanny L. Lewyn, Laguna Beach, Calif.

[73] Assignee: Brooktree Corporation, San Diego, Calif.

[21] Appl. No.: 619,399

[22] Filed: Nov. 29, 1990

[51] Int. Cl.[5] ............................................. H03F 3/16
[52] U.S. Cl. ................................... 330/288; 323/315; 330/311
[58] Field of Search ............... 330/288, 311; 323/315, 323/316

[56] References Cited

U.S. PATENT DOCUMENTS 4,866,399 9/1989 Gose ................................. 330/288

Primary Examiner—James B. Mullins
Attorney, Agent, or Firm—Ellsworth R. Roston; Charles H. Schwartz

[57] ABSTRACT

A balanced cascode current mirror includes first and second current paths respectively defined by first and second transistors and by third and fourth transistors. Each current path may include the sources and drains of the transistors in such path. Connections may respectively extend between the gates of the first and third transistors and between the gates of the second and fourth transistors to provide the first and third transistors with substantially identical source, gate, and drain impedances. An input current is introduced to the drain of the second transistor and an output current with substantially identical characteristics is obtained from the drain of the fourth transistor. A capacitance may be connected between the drain of the second transistor and the gate of the first transistor to produce a flow of current at high frequencies through the first current path corresponding to the input current at the drain of the second transistor. A fifth transistor may be connected in a circuit with a constant current source to regulate the current through the first and second transistors to be substantially equal to the input current at low frequencies. The gate of the fifth transistor may be connected to the drain of the second transistor, and the source of the fifth transistor may be connected to the gate of the first transistor, to provide this current regulation. The gates of the second and fourth transistors and the drain of the fifth transistor may have a common reference potential such as ground.

16 Claims, 1 Drawing Sheet

BALANCED CASCODE CURRENT MIRROR

This invention relates to current mirrors. More particularly, the invention relates to a balanced cascode current mirror in which the output current corresponds to the input current through a wide range of frequencies.

Current mirrors are used often in electronic systems to produce an output current corresponding to an input current. The current mirrors are provided with two (2) branches or current paths. The input current is introduced to one branch, or current path, the branches or current paths being interconnected to produce the output current at the second branch or current path. The output from the second branch or current path is often introduced to an amplifier to provide amplification.

The current mirrors now in use have been found to have limitations which become aggravated with increases in frequency. This results from the fact that the impedances of the individual transistors in the first path do not match the impedances of the corresponding transistors in the second path. The differences in the impedances between the transistors in the first and second branches result from the fact that the transistors in the first path are connected to operate as diodes whereas the transistors in the second path operate as common-source amplifiers. Since the frequencies of electrical circuits on integrated circuit chips have been progressively increasing with time, the differences between the characteristics of the output current relative to the input current in current mirrors have become progressively serious. Attempts have been made to resolve such problems but with limited success.

This invention provides a current mirror which overcomes the problems discussed in the previous paragraph. It provides two branches or current paths, one for the input current and the other for the output current, and provides a balanced relationship between the impedances in the two current paths. Furthermore, it provides for a balanced response of the two current paths to changes in the input current at high frequencies. It also provides for a good balance of the current between the first current paths at low frequencies. In this way, the output current in the second current path corresponds to the input current in the first current path through a range of frequencies considerably greater than in the prior art.

In one embodiment of the invention, a balanced cascode current mirror includes a first current path defined by first and second transistors and a second current path defined by third and fourth transistors. Each current path may include the sources and drains of the transistors in such current path. Connections may respectively extend between the gates of the first and third transistors and between the gates of the second and fourth transistors to provide the first and second transistors with substantially identical source, gate, and drain impedances. An input current is introduced to the drain of the second transistor and an output current with substantially identical characteristics is obtained from the drain of the fourth transistor.

A capacitance may be connected between the drain of the second transistor and the gate of the first transistor to produce a flow of a current through the first current path at high frequencies corresponding to the input current at the drain of the second transistor. A fifth transistor may be connected in a circuit with a constant current source to regulate the current through the first and second transistors as that such current is equal to the input current at low frequencies. The gate of the fifth transistor may be connected to the drain of the second transistor, and the source of the fifth transistor may be connected to the gate of the first transistor, to provide this current regulation. The gates of the second and fourth transistors and the drain of the fifth transistor may have a common reference potential such as ground.

Figure 1:
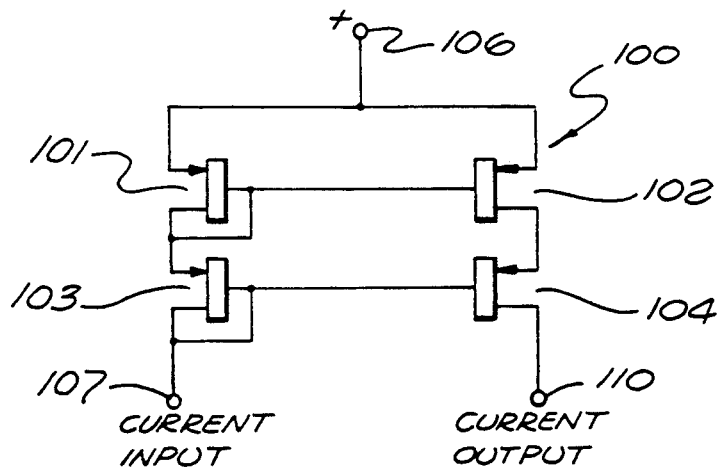
FIG. 1 is a circuit diagram of a current mirror of the prior art.

FIG. 1 shows one embodiment of a current mirror, generally indicated at 100, of the prior art. The current mirror is generally indicated at 100 and is shown as comprising four (4) transistors 101, 102, 103 and 104. These transistors are shown in FIG. 1 as being formed by a CMOS process and as constituting p types of transistors. However, it will be appreciated that the transistors may be n-type transistors fabricated by the CMOS process or that they may be fabricated by other processes such as the bipolar process.

In the current mirror 100 shown in FIG. 1, the sources of the transistors 101 and 102 may be connected to a source 106 of positive voltage. The gate and the drain of the transistor 101 are common with the source of the transistor 103 and the gate of the transistor 102. The gate and the drain of the transistor 103 have a common connection with a line 107 and with the gate of the transistor 104. The drain of the transistor 102 is connected to the source of the transistor 104 and the drain of the transistor 104 is connected to a line 110 for providing a current output.

In the embodiment shown in FIG. 1, the input current introduced to the line 107 flows through a current path defined by the transistors 101 and 103. The resultant voltages produced on the drain and gate of the transistor 101 and on the drain and gate of the transistor 103 are respective introduced to the gates of the transistors 102 and 104. This theoretically causes the current output on the line 110 to match the current input on the line 107. The current output on the line 110 may be introduced to an amplifier stage (not shown).

There are several inherent disadvantages with the current mirror shown in FIG. 1, particularly at high frequencies. This results from the fact that the current mirror is not particularly well balanced at high frequencies. For example, the drain and gate of the transistor 101 are common but the drain and gate of the transistor 102 are not common. Similarly, the drain and gate of the transistor 103 are common but the drain and gate of the transistor 104 are not common. This causes the impedance seen by the drain of the transistor 101 at high frequencies to be considerably less than the impedance seen by the drain of the transistor 102 at such high frequencies. This impedance difference will cause the current balance of the current mirror 100 to be upset at high frequencies.

Another problem with the current mirror 100 at high frequencies is that the input current on the line 107 passes initially through the impedance of the transistor 103 before charging the gate capacitances of the transistors 101 and 102. For a particular phase lag in the current mirror 100, the presence of the transistor 103 causes the frequency to be at least a factor of two (2) lower than if the transistor 103 were not in the current path between the current input on the line 107 and the gate of the transistor 101.

Figure 2:
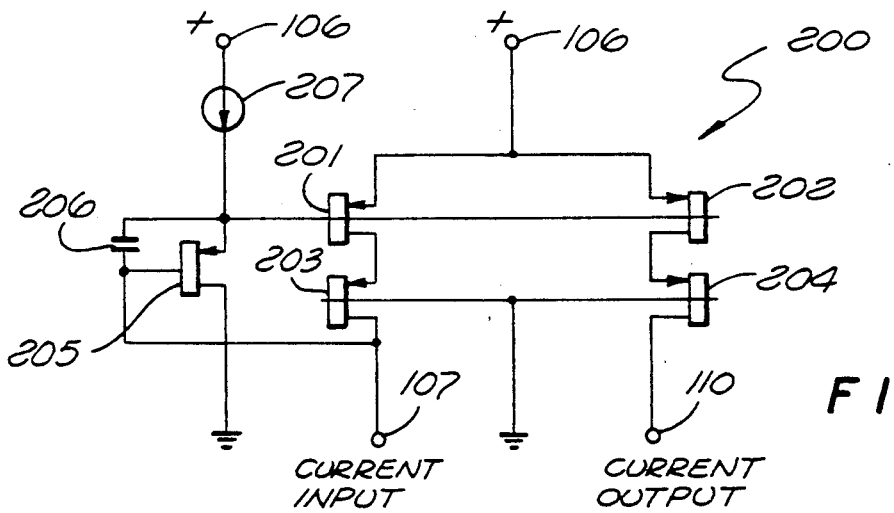
FIG. 2 is a simplified circuit diagram of a balanced cascode current mirror constituting one embodiment of the invention.

FIG. 2 provides a balanced cascode current mirror, generally indicated at 200, which constitutes one embodiment of the invention and which overcomes the disadvantages discussed above with respect to the prior art embodiment shown in FIG. 1. In the embodiment shown in FIG. 2, the current input is provided on the line 107 and the current output is obtained from the line 110 as in the embodiment shown in FIG. 1. The embodiment shown in FIG. 2 further includes transistors 201, 202, 203 and 204 which may be fabricated by the CMOS process and may comprise p-type transistors. However, as in the embodiment shown in FIG. 1, the transistors may be fabricated by other processes and may be other than p-type transistors.

The embodiment shown in FIG. 2 includes a supply 106 of positive voltage. This supply is connected to the sources of the transistors 201 and 202. The drain of the transistor 201 has a common connection with the source of the transistor 203. The drain of the transistor 205 is connected to a source of reference potential such as ground. In like manner, the drain of the transistor 202 has a common connection with the source of the transistor 204. The drain of the transistor 204 is common with the line 110 providing the current output. The gates of the transistors 203 and 204 have a common connection with a reference potential such as ground.

A connection is made from the drain of the transistor 203 to the gate of transistor 205 and one terminal of a capacitor 206, the other terminal of which is common with the gates of the transistors 201 and 202. The drain of the transistor 203 is also connected to the gate of a transistor 205, the drain of which is at the reference potential such as ground. The source of the transistor 205 is connected to the gates of the transistors 201 and 202. A source 207 of constant current is connected between the source of the transistor 205 and the voltage source 106.

Current flows through the current path defined by the transistors 201 and 203 in accordance with the current input on the line 107. The current flow through the transistors 201 and 203 is facilitated at high frequencies by the capacitance 206 which couples fast changes in the current input on the line 107 directly to the gates of the transistors 201 and 202 without requiring that these fast changes pass through other components. For example, when the current input on the line 107 increases rapidly, the voltage introduced through the capacitance 206 to the gates of the transistor 201 and 202 decreases rapidly and causes the currents through the transistors 201 and 202 to increase. In this way, the current changes in the path defined by the transistors 201 and 203 and in the path defined by the transistors 202 and 204 match the changes in the current input on the line 107 at high frequencies.

The change in the current paths is facilitated by the fact that the transistors 201 and 202 respectively see low load impedances. The load impedances are low because they are provided by the transistors 203 and 204 with the grounded gates. As will be appreciated, the current flowing through the path defined by the transistors 202 and 204 is equal to the current flowing through the transistors 201 and 203 because the impedances of the transistors 202 and 204 respectively match the impedances of the transistors 201 and 203.

The current mirror shown in FIG. 2 also operates advantageously at low frequencies and at DC. This results from the operation of the transistor 205 in providing a low frequency coupling of the voltage on the current input line 107 from the gate of the transistor 205 to the source of the transistor 205. The voltage on the source of the transistor 205 is in turn introduced to the gates of the transistors 201 and 202 to produce a flow of current through the paths defined by the transistors 201 and 203 and by the transistors 202 and 204 in accordance with the current input on the line 107.

The operation of the transistor 205 may be further seen from a specific example. Assume that, at low frequencies, the voltage on the gate of the transistor 201 is too positive to produce a sufficient flow of current through the transistors 201 and 203 to match the current input on the line 107. Since the current flow through the transistor 201 is low, the current through the transistor 203 is also low. This causes the voltage on the drain of the transistor 203 and the gate of the transistor 205 to be low.

Because of the constant current through the transistor 205 as a result of the operation of the current source 207, the voltage on the source of the transistor 205 decreases in accordance with the decrease in the voltage on the gate of the transistor 205. The decreased voltage on the source of the transistor 205 is introduced to the gates of the transistors 201 and 202 to produce an increase in the currents through these transistors. In this way, the transistor 205 provides a servo path at low frequencies to regulate the current through the path defined by the transistors 201 and 203, and the path defined by the transistors 202 and 204, in accordance with the current input on the line 107.

Figure 3:
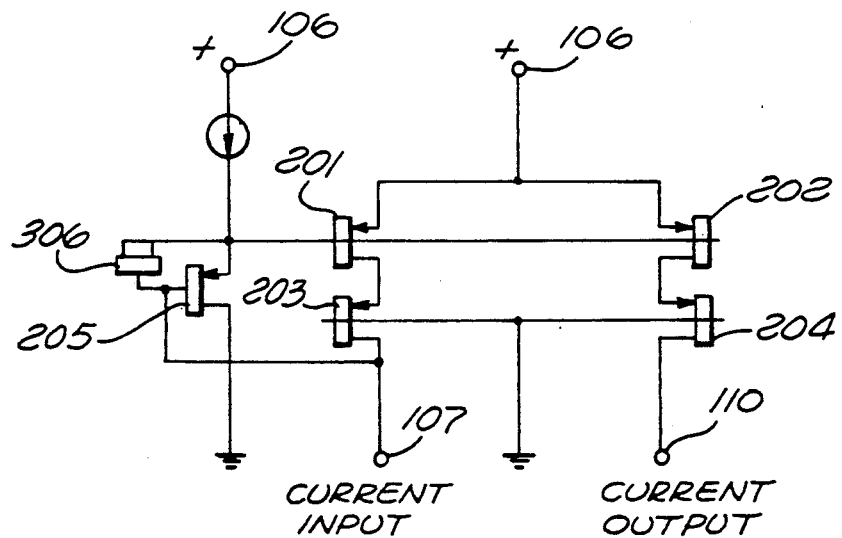
FIG. 3 is a circuit diagram of the balanced cascode current mirror of FIG. 2 with a transistor in FIG. 3 functioning as a capacitor in FIG. 2.

The circuit shown in FIG. 3 is identical to the circuit shown in FIG. 2 except that it includes a transistor 306 instead of the capacitance 206. The gate of the transistor 306 is connected to the drain of the transistor 203 and the source and the drain of the transistor 306 are connected to the gates of the transistors 201 and 202. The transistor 306 operates in a manner similar to that described above for the capacitor 206.

The current mirror constituting this invention has certain important advantages over the prior art. One advantage is that it is well balanced. Another advantage is that it includes cascode transistors for providing matched low impedances in each of the input and output current paths. A further advantage is that the current mirror responds rapidly to changes at high frequencies in the current input on the line 107. In addition, the current through the path defined by the transistors 201 and 203 and the path defined by the transistors 202 and 204 is regulated at low frequencies to assure that the currents through these paths match the current input on the line 107.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination, a first transistor having first particular load impedances, a second transistor providing load impedances corresponding to that of the first transistor, a third transistor connected in a series circuit with the first transistor and providing a second particular load impedance, a fourth transistor connected in a series circuit with the second transistor and providing a load impedance corresponding to that of the third transistor, first means for introducing an input current to the third transistor, second means for obtaining an output current from the fourth transistor, third means connected between the first and third transistors for introducing a voltage at high frequencies from the third transistor to the first transistor to regulate the flow of current through the first and second transistors in accordance with the input current introduced to the third transistor, and fourth means connected between the first and third transistors for regulating the current through the first and third transistors at low frequencies in accordance with the current input to the third transistor, and the first and third transistors being respectively connected to the second and fourth transistors to produce the same flow of current through the second and fourth transistors as through the first and third transistors.

2. In a combination as recited in claim 1, the third means including a capacitance connected between the first and third transistors for introducing the voltage at high frequencies from the third transistor to the first transistor to regulate the flow of current through the first and second transistors in accordance with the input current introduced to the third transistor.

3. In a combination as set forth in claim 1, the fourth means including a fifth transistor connected to the first and third transistors for applying a bias to the first transistor to regulate the current through the first and third transistors in accordance with the input current applied to the third transistor.

4. In a combination as set forth in claim 3, the fourth means further including a constant current source in series with the fifth transistor for producing the flow of a substantially constant current through the fifth transistor.

5. In combination, a first current path including first and second transistors, first means for introducing an input current to the second transistor to obtain a flow of this current through the first current path, a second current path including third and fourth transistors, second means for connecting the first and third transistors and the second and fourth transistors to provide an impedance in the second transistor corresponding to the impedance in the first transistor and to provide an impedance in the fourth transistor corresponding to the impedance in the third transistor and to provide a flow of current through the second current path corresponding to the flow of current through the first current path, third means for coupling the first and second transistors to provide for a high frequency biasing of the first transistor in accordance with the input current introduced to the second transistor, and fourth means for coupling the first and second transistors to provide for a low frequency biasing of the first transistor to regulate the flow of the input current through the first and second transistors in accordance with the input current introduced to the second transistor.

6. In a combination as set forth in claim 5, the third means including a capacitor coupling the first and second transistors at high frequencies to provide for the flow of the input current through the first current path.

7. In a combination as set forth in claim 5, the fourth means including a fifth transistor biased in accordance with differences between the input current and the current through the first and second transistors to regulate the current through the first and second transistors to conform to the input current.

8. In a combination as set forth in claim 5, the third means including a capacitor coupling the first and third transistors at high frequencies to provide for a flow of the input current through the first current path, and the fourth means including a fifth transistor and a constant current source providing a substantially constant current through the fifth transistor, the fourth means being variably biased in accordance with variations in the current through the first and second transistors to regulate the current through the first current path to conform to the input current.

9. In combination, first, second, third and fourth transistors each having first, second and third electrodes, first means defining a first current path with the first and third electrodes of the first and second transistors, second means defining a second current path with the first and third electrodes of the third and fourth transistors, third means for connecting the second electrodes of the first and third transistors and the second electrodes of the second and fourth transistors, fourth means for providing an input current to the third electrode of the second transistor, fifth means for providing an output current from the third electrode to the fourth transistor, sixth means coupling the third electrode of the second transistor and the second electrode of the first transistor at high frequencies to obtain the flow of the input current through the first and second transistors at the high frequencies, and seventh means coupling the third electrode of the second transistor and the second electrode of the first transistor at low frequencies to regulate the flow of current through the first and second transistors in accordance with the input current to the third electrode of the second transistors.

10. In a combination as set forth in claim 9, the sixth means including a capacitor connected between the third electrode of the second transistor and the second electrode of the first transistor and provided with a value to pass changes produced at high frequencies in the voltage on the third electrode of the second transistor, as a result of changes in the input current, to the second electrode of the first transistor to maintain the current through the first and second transistors equal to the input current.

11. In a combination as set forth in claim 9, the seventh means including a fifth transistor having first, second and third electrodes and further including a source of constant current, the second electrode of the fifth transistor being biased at low frequencies by the voltage on the third electrode of the second transistor, the constant current source being connected in a circuit with the first and third electrodes of the fifth transistor to bias the second electrode of the first transistor at low frequencies in accordance with the voltage on the third electrode of the second transistor.

12. In a combination as set forth in claim 11, the sixth means including a capacitor connected between the third electrode of the second transistor and the second electrode of the first transistor and provided with a value to pass changes produced at high frequencies in the voltage on the third electrode of the second transistor, as a result of changes in the input current, to the second electrode of the first transistor to maintain the current through the first and second transistors equal to the input current, and the second electrodes of the second and fourth transistors and the third electrode of the fifth transistor having a common reference potential.

13. In combination, first and second transistors in a first current path, first means for introducing an input current to the first current path, third and fourth transistors in a second current path, second means for providing an output current in the second current path, third means associated with the first current path for regulating the current through the first and second transistors at high frequencies in accordance with the input current introduced to the first current path, fourth means associated with the second current path for regulating the current through the first and second transistors at low frequencies in accordance with the input current introduced to the first current path, and fifth means coupling the first and second transistors to the third and fourth transistors to provide for the operation of the third and fourth transistors in the second current path as a current mirror of the operation of the first and second transistors in the first current path.

14. In a combination as set forth in claim 13, the third means being operative to introduce changes at high frequencies in the voltage from the second transistor to the first transistor to regulate the current through the first and second transistors in accordance with the current introduced to the first current path.

15. In a combination as set forth in claim 13, the fourth means being operative to introduce changes at low frequencies in the voltage from the second transistor to the first transistor to regulate the current through the first and second transistors in accordance with the current introduced to the first current path.

16. In a combination as set forth in claim 13, the fourth means including a fifth transistor and a constant current source connected in a third current path.

* * * * *